United States Patent [19]

Kamata et al.

[11] Patent Number: 4,658,438
[45] Date of Patent: Apr. 14, 1987

[54] RECEIVER FOR SATELLITE BROADCASTING SERVICE

[75] Inventors: Hiroshi Kamata; Wataru Okubo, both of Soma, Japan

[73] Assignee: Alps Electric Co., Ltd., Japan

[21] Appl. No.: 775,599

[22] Filed: Sep. 13, 1985

[30] Foreign Application Priority Data

Sep. 17, 1984 [JP] Japan ............... 59-194283

[51] Int. Cl.⁴ .............................. H04B 1/16
[52] U.S. Cl. ................... 455/264; 455/192; 455/208; 455/265; 358/188
[58] Field of Search ............. 455/192, 208, 258, 131, 455/261–265; 329/122, 123; 358/188, 195.1

[56] References Cited

U.S. PATENT DOCUMENTS

| | | | |
|---|---|---|---|
| 3,421,090 | 1/1969 | Fitch et al. | 455/208 |
| 3,991,371 | 11/1976 | Shelby | 455/192 |
| 4,293,818 | 10/1981 | Jarger | 455/208 |
| 4,601,061 | 7/1986 | Carney et al. | 455/208 |

FOREIGN PATENT DOCUMENTS

| | | | |
|---|---|---|---|
| 12512 | 1/1977 | Japan | 455/264 |
| 124320 | 9/1980 | Japan | 455/264 |

OTHER PUBLICATIONS

"A 12-GHz Low Cost Earth Terminal for Direct TV Reception from Broadcast Satellites" by Douville 12/77.

*Primary Examiner*—Jin F. Ng
*Attorney, Agent, or Firm*—Guy W. Shoup

[57] ABSTRACT

In a receiver for satellite broadcasting service, a selected audio subcarrier is converted into an IF signal demodulated into a demodulated signal which is applied to a feedback voltage generating means which converts the applied signal into a feedback voltage at a voltage ratio corresponding to the maximum frequency deviation of the selected audio subcarrier. The feedback voltage is applied by an operational amplifier to a varactor diode in a voltage-controlled oscillator. The oscillation frequency of the voltage-controlled oscillator is therefore varied dependent on the frequency deviation of the selected audio subcarrier to cause the maximum frequency deviation of the IF signal from a frequency mixer to match the bandwidth of a bandpass filter.

3 Claims, 7 Drawing Figures

RECEIVER FOR SATELLITE BROADCASTING SERVICE

BACKGROUND OF THE INVENTION

The present invention relates to a receiver for receiving a television signal radiated from a broadcasting satellite, and more particularly to an audio processor in such a receiver for processing a plurality of frequency-modulated subcarriers contained in the television signal.

In recent years, broadcasting programs are supplied to a CATV via a broadcasting satellite. As shown in FIG. 3 of the accompanying drawings, a receiver used in such a CATV system has a parabolic antenna 1 which receives a bandwidth signal containing channel signals in a band of 3.7 to 4.2 GHz transmitted from the broadcasting satellite. A low-noise block converter (LNB) 2 coupled to the antenna 1 converts, by way of group conversion, the received signal into a bandwidth signal in the range of from 950 to 1450 MHz. Thus, the received signal is converted into a signal of a first intermediate frequency (first IF signal).

The first IF signal is then transmitted over a coaxial cable 3 to a channel selector 4 in an indoor section of the receiver. The channel selector 4 selects a desired television signal out of a plurality of channels having an allowable occupied bandwidth such as 36 MHz. The selected television signal is converted by the channel selector 4 into a signal of a second intermediate frequency (600 MHz, for example), from which noise is removed by a bandwidth filter 5. The signal is then demodulated by a frequency demodulator 6 to produce a baseband signal. The baseband signal is applied to both a video signal processor 7 and an audio signal processor 8. The video signal processor 7 produces a video signal, while the audio signal processor 8 produces an audio signal.

As shown in FIG. 4, the baseband signal contains a plurality of audio subcarriers b (up to 16 subcarriers) in a bandwidth of 5 MHz to 8.5 MHz for one channel. The band is utilized in different conversion formats by different transmitting stations. More specifically, there are no standards established for the format of the multiplexing conversion system and the maximum frequency deviation of the audio subcarriers. Therefore, it has been customary for the operator for the CATV system to switch formats and set the frequency deviation to a prescribed value while referring to a list of programs previously distributed for each channel. Designated in FIG. 4 at a is a video signal with its low-frequency-range level lowered due to preemphasis effected in the transmitting station.

For processing a single (fixed) subcarrier in the audio signal processor 8, it is necessary to use only a single bandpass filter 9 corresponding to the audio subcarrier to be processed, as illustrated in FIG. 5. Where the audio subcarrier has a central frequency of 6.8 MHz with a maximum frequency deviation of ±75 KHz, a bandpass filter having a central frequency of 6.8 MHz and a bandwidth corresponding to the frequency deviation should be used. Denoted in FIG. 5 at 10 is an audio demodulator, 11 a deemphasis circuit, 12 a volume control, and 13 an audio amplifier.

Where a plurality of audio subcarriers with different maximum frequency deviations are to be selected, it would be possible as shown in FIG. 6 to employ a frequency converter composed of a frequency mixer 14 and a voltage-controlled oscillator 15 for converting each of the audio subcarriers into an IF signal having a central frequency of 10.7 MHz, and to pass the IF signal through a bandpass ceramic filter 16 having a central frequency of 10.7 MHz and a bandwidth of ±75 KHz, with the resulting signal being demodulated by an audio demodulator 10.

Even if the audio subcarriers with different maximum frequency deviations were converted into the IF signal, however, the following problem would occur by passing the IF signal through the sole bandpass ceramic filter 16: For converting an audio subcarrier having a large maximum frequency deviation into an IF signal, the maximum frequency deviation of the IF signal would be greater than the bandwidth of the filter 16, and hence the S/N ratio of a demodulated audio signal would be increased. For converting an audio subcarrier having a small maximum frequency deviation into an IF signal, the maximum frequency deviation of the IF signal would be smaller than the bandwidth of the filter 16, resulting in a THD (Total Harmonic Distortion) to which a demodulated audio signal is subjected.

One conventional solution has been to provide, as shown in FIG. 7, a wide-bandpass filter 17 and a narrow-bandpass filter 18 parallel to the bandpass filter 16, and to select these filters 16, 17 and 18 with a switch 19 dependent on audio subcarriers with different maximum frequency deviations for thereby producing an audio signal for good sound quality.

However, where IF signals with different maximum frequency deviations are demodulated by a plurality of filters having different bandwidths, the levels of demodulated signals vary with the frequency deviations, and hence the level of a reproduced sound has to be adjusted each time one of the audio subcarriers is selected. Therefore, controlling the receiver has been tedious and time-consuming. With the filters of different bandwidths used for the respective audio subcarriers, the receiver is complicated in construction and costly to manufacture.

SUMMARY OF THE INVENTION

It is an object of the present invention to provide a receiver for satellite broadcasting, which has a single bandpass filter for demodulating a plurality of subcarriers having different maximum frequency deviations into audio signals at a constant level.

According to the present invention, a selected audio subcarrier is converted into an IF signal demodulated into a demodulated signal which is applied to a feedback voltage generating means which converts the applied signal into a feedback voltage at a voltage ratio corresponding to the maximum frequency deviation of the selected audio subcarrier. The feedback voltage is applied by an operational amplifier to a varactor diode in a voltage-controlled oscillator. The oscillation frequency of the voltage-controlled oscillator is therefore varied dependent on the frequency deviation of the selected audio subcarrier to cause the maximum frequency deviation of the IF signal from a frequency mixer to match the bandwidth of a bandpass filter.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 2:
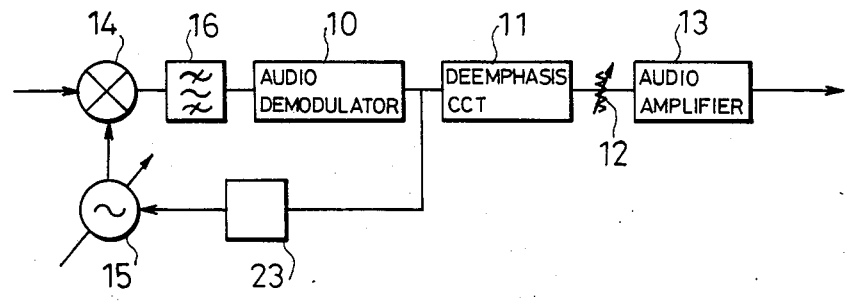
FIG. 2 is a block diagram of the audio processor shown in FIG. 1.
Figure 3:
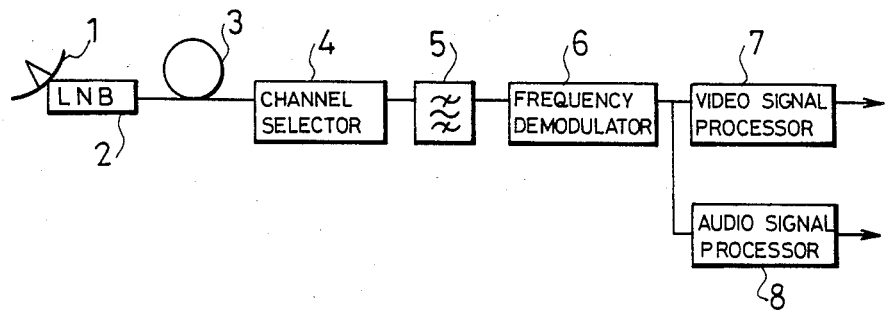
FIG. 3 is a block diagram schematically showing a CATV system.
Figure 4:
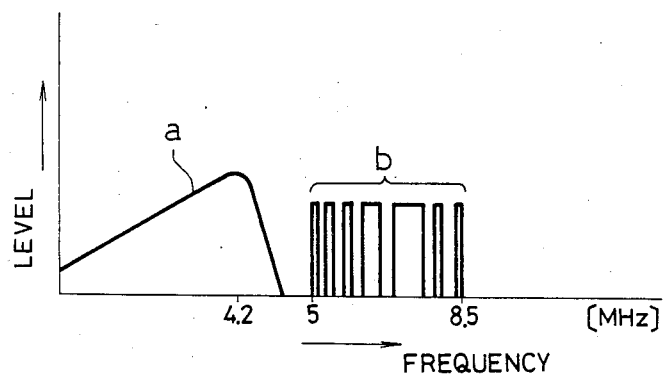
FIG. 4 is a diagram showing a spectrum distribution of a baseband signal.
Figure 5:
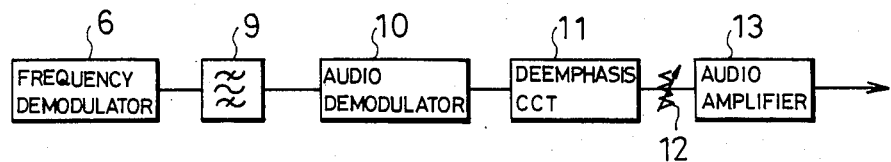
FIGS. 5 through 7 are block diagrams of audio processors in conventional receivers.
Figure 6:
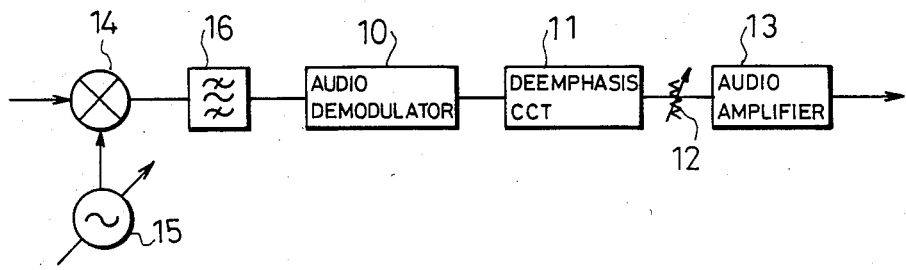
Figure 7:
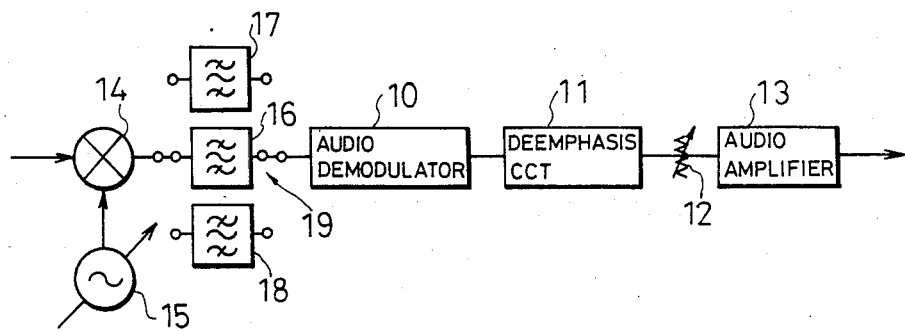

AS shown in FIG. 2, au audio processor in a receiver for satellite broadcasting service has a frequency mixer 14 supplied with an oscillating input signal from a voltage-controlled oscillator 5. The frequency mixer 14 has an output terminal connected to a bandpass ceramic filter 16 for passing a frequency-converted intermediate frequency signal. The bandpass ceramic filter 16 has an output terminal coupled to an audio demodulator 10 connected to a deemphasis circuit 1 which is coupled via a volume control 12 to an audio amplifier 13.

Figure 1:
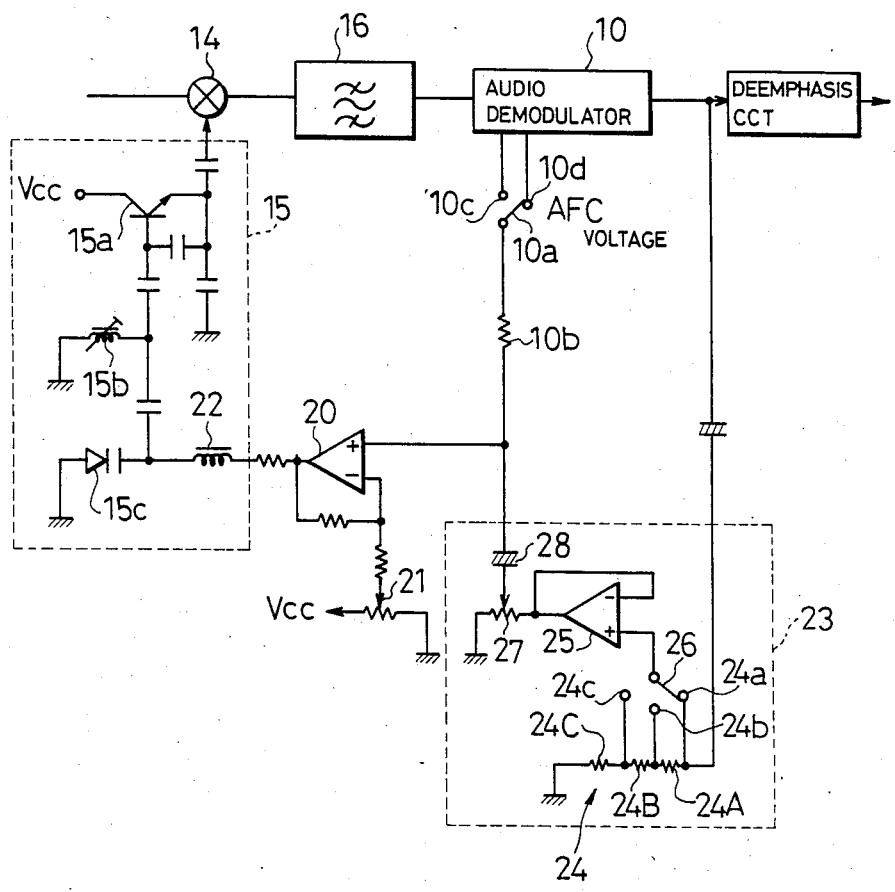
FIG. 1 is a circuit diagram, partly in block form, of an audio processor in a receiver according to the present invention.

The output terminal of the audio demodulator 10 is connected to a feedback circuit 23, which as shown in FIG. 1 comprises a feedback voltage generating bleeder 24 connected to the audio demodulator 10, and an operational amplifier 25 connected by a changeover switch 26 to the bleeder 24. The feedback voltage generating bleeder 24 has resistors 24A, 24B, 24C for converting a demodulated signal from the audio amplifier 10 into feedback voltages. The feedback voltage generating bleeder 24 also includes a tap 24a for issuing a demodulated signal voltage directly as a feedback voltage, a tap 24b for issuing a demodulated signal voltage dropped by the resistor 24A as a feedback voltage, and a tap 24c for issuing a demodulated signal voltage dropped by the resistors 24A, 24B as a feedback voltage. These taps 24a through 24c are connected through the changeover switch 26 to the non-inverting input terminal of the operational amplifier 25. The operational amplifier 25 constitutes a negative feedback circuit arrangement having a gain of 1 with an inverting input terminal supplied with a feedback signal. Since the operational amplifier 25 has a wide frequency band though its amplification degree is low, it can accurately detect variations in the demodulated signal, that is, variations in the feedback voltage from the bleeder 24. The operational amplifier 25 has an output terminal connected to a volume control 27 for fine adjustment of an audio level, the volume control 27 being coupled via a coupling capacitor 28 to the non-inverting input terminal of a control operational amplifier 20.

As shown in FIG. 1, the voltage-controlled oscillator 15 has a resonance circuit composed of a semi-fixed tuning coil 15a connected to the base of a transistor 15a and a baractor diode 15c. The voltage-controlled oscillator 15 controls its oscillation frequency with variations of capacitance of the varactor diode 15c. The audio demodulator 10 issues an automatic frequency control (AFC) voltage which is applied through an AFC switch 10a and a voltage combining resistor 10b to the non-inverting input terminal of the control operational amplifier 20. The control operational amplifier 20 has an inverting input terminal connected to a volume control 21 for selecting audio subcarriers and an output terminal coupled to the varactor diode 15c through a high-frequency blocking choke 22. Where an audio subcarrier having a central frequency of 82.5 MHz is selected while the audio amplifier 10 is arranged to demodulate the audio subcarrier with a central frequency of 10.7 MHz, the AFC switch 10a is switched to a reference voltage (for example 5.6 V) output terminal 10c. The volume control 21 is adjusted to supply a prescribed voltage from the operational amplifier 20 to the varactor diode 15c for tuning the voltage-controlled oscillator 15 so that it will produce an oscillating frequency of 71.8 MHz. Thus, the frequency mixer 14 produces an IF signal having a central frequency of 10.7 MHz, which is passed through the bandpass ceramic filter 16 of a central frequency of 10.7 MHz. An output signal from the bandpass ceramic filter 16 is demodulated into a desired audio signal.

After tuning the audio subcarrier, the AFC switch 10a is shifted to an AFC terminal 10d to apply an AFC voltage from the audio demodulator 10 through the operational amplifier 20 to the varactor diode 15c should the oscillation frequency of the voltage-controlled oscillator 15 vary, thus restoring the oscillation frequency of the voltage-controlled oscillator 15 to 71.8 MHz.

Operation and modes of use of the feedback circuit 23 will now be described.

If the maximum frequency deviation of the selected audio subcarrier having the central frequency of 82.5 MHz is large, for example, 150 KHz, the changeover switch 26 is shifted to the tap 24a. Since the demodulated signal voltage is applied from the tap 24a directly to the operational amplifier 25, a large feedback voltage is imposed on the operational amplifier 25. Therefore, the operational amplifier 25 produces a high voltage corresponding to a variation of the demodulated signal as a control signal, and hence a large voltage corresponding to the demodulated signal is applied through the control operational amplifier 20 to the varactor diode 15c. As a result, the capacitance of the varactor diode 15c varies widely dependent on the voltage variation of the demodulated signal, and the oscillation frequency of the oscillator 15 also varies widely. By applying the varied oscillation signal to the frequency mixer in phase with the audio subcarrier, the frequency deviation of the IF signal issued from the frequency mixer 14 is rendered relatively small. As a consequence, the audio subcarrier with the large maximum frequency deviation is converted into an IF signal with a frequency deviation matching the bandwidth of the bandpass ceramic filter 16, with the result that the audio demodulator 10 produces a demodulated signal having a constant amplitude. It is therefore not necessary to adjust the audio level each time an audio subcarrier is selected.

Assuming that the frequency deviation of an audio subcarrier is indicated by f (D), and the frequency deviation of the voltage-controlled oscillator 15 by f (VCO), the frequency deviation $\Delta f$ (IF) of the IF signal can be expressed by the following equation:

$$\Delta f(IF) = f(D) - f(VCO) \tag{1}$$

If the bandwidth of the bandpass filter is indicated by BW, the maximum frequency deviation of the IF signal by $\Delta F$ (IF), and a maximum audio modulation frequency by f max, the bandwidth BW can be expressed by the following equation according to the Carson bandwidth rule:

$$BW = 2\{\Delta F \text{ (IF)} + f \max\} \quad (2)$$

For example, when BW is 150 KHz and f max is 15 KHz, $$150 = 2\{(\Delta F(IF) + 15\}$$

and hence ΔF (IF) is 60 KHz. Therefore, if the maximum frequency deviation of the audio subcarrier is 150 KHz, then the maximum frequency deviation ΔF (VCO) of the voltage-controlled oscillator 15 is 90 KHz from the equation (1).

It follows from the foregoing that in case the bandpass ceramic filter 16 has a bandwidth of 150 KHz and a subcarrier having a maximum frequency deviation of 150 KHz is selected, the oscillation frequency of the voltage-controlled oscillator 15 should be deviated in the range of ±90 KHz dependent on a variation of the demodulated signal, and the deviated frequency signal should be applied to the frequency mixer in phase with the audio subcarrier. The feedback voltage from the tap 24a should be predetermined based on the foregoing equations so that the amount of feedback by the control operational amplifier 20 will deviate the oscillation frequency of the oscillator 15 in the range of ±90 KHz.

If an audio subcarrier having a smaller maximum frequency deviation is selected, then the bandwidth of the bandpass ceramic filter 16 becomes greater than the maximum frequency deviation of the IF signal issued from the frequency mixer 14. In this case, the changeover switch 26 is shifted to the tap 24c to apply a lower feedback voltage obtained by dropping the small demodulated signal through the resistors 24A, 24B to the operational amplifier 25. Therefore, a small voltage is applied to the varactor diode 15c in the voltage-controlled oscillator 15, which produces an oscillation frequency that varies to a small extent.

If the maximum frequency deviation of an audio subcarrier is 50 KHz and the maximum audio modulation frequency f max is 5 KHz, then the maximum frequency deviation ΔF (VCO) of the voltage-controlled oscillator 15 becomes −20 KHz for a filter having a bandwidth of 150 KHz according to the equations (1) and (2). Thus, if an audio subcarrier having a small maximum frequency deviation is selected, as described above, the varying oscillation voltage of the voltage-controlled oscillator 15 is applied to the frequency mixer 14 in opposite phase with the audio subcarrier to increase the frequency deviation of the IF signal corresponding to the bandwidth of the bandpass ceramic filter 16. With the frequency deviation of the IF signal being increased corresponding to the filter 16, the audio demodulator 10 produces a demodulated signal of a constant amplitude and it is not necessary to effect volume control.

In the event the audio demodulator 10 is fabricated as an IC, the level of a demodulated signal may be subjected to variations. Should this happen, the fine-adjustment volume control 27 is adjusted to set the frequency deviation of the IF signal to a desired value.

The volume control 27 may be employed to adjust the sound level positively.

With the present invention, as described above, a demodulated signal is fed back to a feedback voltage generating means which produces a feedback voltage at a voltage ratio corresponding to the maximum frequency deviation of a selected audio subcarrier, and a variation in the feedback signal is accurately detected by an operational amplifier and issued as a control signal to a voltage-controlled oscillator, whereby the oscillation frequency of the voltage-controlled oscillator is varied dependent on the frequency deviation of the selected audio subcarrier. Since audio subcarriers having different maximum frequency deviations can be converted into IF signals of a constant maximum frequency deviation, therefore, demodulated signals of a constant amplitude can be produced with a single bandpass filter employed. Where there are a plurality of audio subcarriers to choose from, it is not necessary to effect volume adjustment. The receiver for satellite broadcasting service according to the present invention is also simple in structure, small in size, and inexpensive to manufacture.

Although a certain preferred embodiment has been shown and described, it should be understood that many changes and modifications may be made therein without departing from the scope of the appended claims.

What is claimed is:

1. A receiver for receiving a television signal radiated from a broadcasting satellite and containing a plurality of frequency-modulated audio subcarriers having different maximum frequency deviations, said receiver comprising:
   (a) a frequency mixer receptive of a selected audio subcarrier;
   (b) a voltage-controlled oscillator for applying an oscillation signal to said frequency mixer to convert said selected audio subcarrier into an intermediate-frequency audio subcarrier;
   (c) a bandpass filter for passing said intermediate-frequency audio subcarrier;
   (d) an audio demodulator for demodulating said intermediate-frequency audio subcarrier having passed through said bandpass filter; and
   (e) a feedback circuit composed of feedback voltage generating means for converting a demodulated signal fed back from said audio demodulator into a feedback voltage at a voltage ratio corresponding to the maximum frequency deviation of said selected audio subcarrier, and an operational amplifier for applying a control signal to said voltage-controlled oscillator in response to said feedback voltage to control an oscillation signal of said voltage-controlled oscillator so that the maximum frequency deviation of the intermediate-frequency audio subcarrier issued from said frequency mixer will match the bandwidth of said bandpass filter.

2. A receiver according to claim 1, wherein said feedback voltage generating means comprises a bleeder composed of a plurality of series-connected resistors connected to said audio demodulator, a plurality of taps connected to said resistors, respectively, for producing a plurality of feedback voltages, and a changeover switch for selecting one of the feedback voltages at a time and applying the selected feddback voltage to said operational amplifier.

3. A receiver according to claim 1, wherein said voltage-controlled oscillator includes a varactor diode to which said selected feedback voltage is applied via an operational amplifier.

* * * * *